US009580808B2

(12) United States Patent
Milicevic et al.

(10) Patent No.: US 9,580,808 B2
(45) Date of Patent: Feb. 28, 2017

(54) APPARATUS FOR PERFORMING A PLASMA CHEMICAL VAPOUR DEPOSITION PROCESS (71) Applicant: DRAKA COMTEQ B.V., Eindhoven (NL)

(72) Inventors: Igor Milicevic, Eindhoven (NL); Mattheus Jacobus Nicolaas Van Stralen, Eindhoven (NL); Johannes Antoon Hartsuiker, Eindhoven (NL)

(73) Assignee: Draka Comteq B.V. (NL)

( * ) Notice: Subject to any disclaimer, the term of this patent is extended or adjusted under 35 U.S.C. 154(b) by 288 days.

(21) Appl. No.: 13/715,374

(22) Filed: Dec. 14, 2012

(65) Prior Publication Data

US 2013/0152858 A1    Jun. 20, 2013

(30) Foreign Application Priority Data

Dec. 14, 2011    (NL) ...................................... 2007968

(51) Int. Cl.
*C23C 16/00*  (2006.01)
*C23F 1/00*  (2006.01)
*H01L 21/306*  (2006.01)
*C23C 16/511*  (2006.01)
*H01J 37/32*  (2006.01)
*C03B 37/018*  (2006.01)

(52) U.S. Cl.
CPC ......... *C23C 16/511* (2013.01); *C03B 37/0183* (2013.01); *H01J 37/32247* (2013.01)

(58) Field of Classification Search
USPC ............................ 118/723 MW; 156/345.41
See application file for complete search history.

(56) References Cited

U.S. PATENT DOCUMENTS

| 3,577,207 | A | * | 5/1971 | Kirjushin | ........................ 315/39 |
| 5,134,965 | A | * | 8/1992 | Tokuda et al. | ....... 118/723 MW |
| 5,707,452 | A | * | 1/1998 | Dandl | .................. 118/723 MW |
| 5,843,236 | A |  | 12/1998 | Yoshiki et al. | |
| 5,874,706 | A | * | 2/1999 | Ishii et al. | ............... 219/121.43 |
| 6,543,380 | B1 | * | 4/2003 | Sung-Spitzl | ......... 118/723 MW |
| 2002/0002949 | A1 | * | 1/2002 | Breuls et al. | ........ 118/723 MW |
| 2007/0054064 | A1 | * | 3/2007 | Ohmi | .................... H01L 21/306 |
|  |  |  |  |  | 427/569 |

(Continued)

FOREIGN PATENT DOCUMENTS

EP    1550640    7/2005
EP    1867610    12/2007

(Continued)

*Primary Examiner* — Rakesh Dhingra
(74) *Attorney, Agent, or Firm* — Patterson Intellectual Property Law PC (57) ABSTRACT The invention relates to an apparatus for performing a plasma chemical vapor deposition process. The apparatus comprises a mainly cylindrical resonator being provided with an outer cylindrical wall enclosing a resonant cavity extending in a circumferential direction around a cylindrical axis. The resonator is further provided with side wall portions bounding the resonant cavity in the cylindrical direction, and with a slit configuration extending in a circumferential direction around the cylindrical axis providing access from the resonant cavity radially inwardly. Further, the slit configuration includes slit sections that are mutually offset in the cylindrical direction.

19 Claims, 4 Drawing Sheets (56) References Cited

U.S. PATENT DOCUMENTS

2007/0289532 A1\* 12/2007 Hartsuiker et al. .... 118/723.001
2008/0274300 A1\* 11/2008 Van Stralen et al. ......... 427/575
2009/0022906 A1     1/2009 van Stralen et al.

FOREIGN PATENT DOCUMENTS

| EP | 1988065 | | 11/2008 | |
|----|---------|---|---------|---|
| FR | EP 0564359 | \* | 10/1993 | .............. H01J 37/32 |
| JP | 2008106333 | | 5/2008 | |
| WO | 9859359 A1 | | 12/1998 | |

\* cited by examiner

APPARATUS FOR PERFORMING A PLASMA CHEMICAL VAPOUR DEPOSITION PROCESS

TECHNICAL FIELD

The invention relates to an apparatus for performing a plasma chemical vapour deposition process, comprising a mainly cylindrical resonator being provided with an outer cylindrical wall enclosing a resonant cavity extending in a circumferential direction around a cylindrical axis, the resonator further being provided with side wall portions bounding the resonant cavity in the cylindrical direction, and with a slit configuration extending in a circumferential direction around the cylindrical axis providing access from the resonant cavity radially inwardly.

BACKGROUND ART

European patent publication EP 1 867 610 in the name of Draka Comteq B.V. discloses such an apparatus for manufacturing an optical fiber. In the plasma activated chemical vapour deposition (PCVD) process, deposition is performed on the inside of a substrate tube. In this process, the resonator is fed by a microwave source (typically a magnetron). Typically, the resonator moves back and forth in the axial direction of the substrate tube. Inside the substrate tube, the microwave power creates a plasma which activates a reaction resulting in deposition of thin quartz layers within the substrate tube. The substrate tube and resonator are placed inside a furnace.

When inspecting the deposition inside the substrate tube, a non-uniform thickness and/or refractive index is observed along the axial direction of the substrate tube. This phenomenon has strong negative impact on some resulting fiber quality parameters such as the attenuation (OTDR traces) and/or the uniformity of mode-field diameter for single mode fiber and/or the uniformity of the alpha-value for multi-mode fiber. The non-uniformity of the deposition thickness includes near periodic variations.

The cause of these variations is the microwave interaction of the resonator with the surrounding, mainly dominated by the metals shell around the furnace, which is needed for construction purposes and for prevention of high microwave leakage for health safety reasons. The effect of the microwave interaction becomes even worse when the amount of deposited glass increases due to a cumulative effect and due to limited adaptive capabilities of the microwave configuration, like the efficiency of the chokes. There can also be lengthwise deposition non-uniformity near the ends of the substrate tube due to reflections of microwave power, guided by the plasma at the tube, at the ends of the furnace. A non-uniform microwave power along the length of the substrate tube causes a length/front position, relative to the resonator position, to change along the length of the substrate tube, thus introducing deviation to deposition targets based on the position of the resonator.

In order to reduce the variations in the deposition thickness, patent publication US 2009/0022906 discloses moving the furnace along the axial direction of the tube. Results show that this approach is effective to a certain extend in smoothing the variations. When the variations are too high, for instance for very thick amount of glass depositions (e.g. CSA larger than circa 350 mm$^2$) and/or very small inside diameters (e.g. smaller than circa 20 mm) and/or high deposition rate (e.g. larger than circa 2.5 g/min) or microwave power (e.g. more than circa 5 kW) and/or better quality requirement, a higher reduction factor may be desirable.

Furthermore, a moving furnace has an additional negative effect, because it decreases the effective core rod length by lowering the total resonator sledge pass length by a distance, which influences the fiber cost in a negative way.

BRIEF SUMMARY

It is an object of the invention to provide an apparatus according to the preamble that is arranged for producing, in an alternative way, a more uniform coating thickness of glass material on the substrate tube. Thereto, according to the invention, wherein the slit configuration includes slit sections that are mutually offset in the cylindrical direction.

By arranging slit sections that are offset in the cylindrical direction, also the variation pattern in deposition thickness at different circumferential positions on the tube is shifted in the cylindrical direction. When rotating the substrate tube, e.g. stepwise, the patterns are repeatedly interchanged, so that the end product shows much less oscillatory behaviour.

Preferably, the offset between slit sections is circa a quarter of the plasma (microwave) wavelength. By tuning the shift distance and, optionally, the mutual intensity difference between distinct plasmas in the tube, a deposition with much less or even without oscillatory behaviour in deposition thickness and/or refractive index can be achieved. Then, fiber quality parameters such as the attenuation (OTDR traces) and/or the uniformity of mode-field width may improve significantly.

By splitting the resonator in different sections, e.g. in two halves with respect to a plane of symmetry of a feeding waveguide, two plasmas are generated that can be shifted in the longitudinal direction of the tube.

Generally, each slit section allows microwave energy to pass radially inwardly to generate plasmas in the substrate tube. Typically, each slit section thus facilitates the existence of corresponding plasmas. Preferably, the intensities of the corresponding passing microwave energy substantially match, so that a balanced plasma configuration is obtained during operation of the apparatus. Also, the load of the plasma is then matched.

Advantageously, the width of the slit sections, i.e. the dimension of the slit gap in the cylindrical direction, mutually differs, thereby matching plasma loads.

Further advantageous embodiments according to the invention are described in the following claims.

BRIEF DESCRIPTION OF THE DRAWINGS

By way of example only, embodiments of the present invention will now be described with reference to the accompanying figures in which.

It is noted that the figures show merely preferred embodiments according to the invention. In the figures, the same reference numbers refer to equal or corresponding parts.

DETAILED DESCRIPTION

Figure 1:
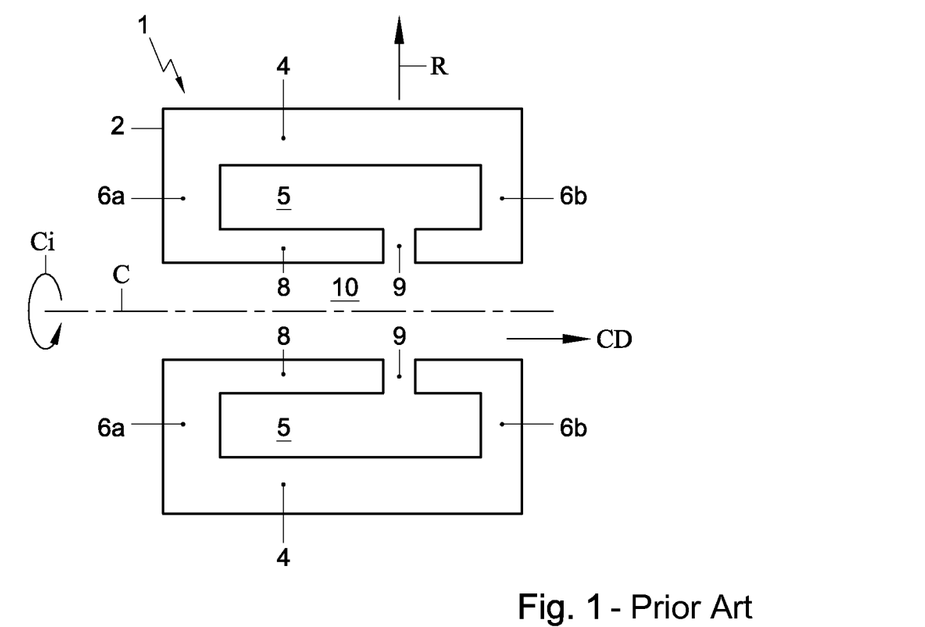
FIG. 1 shows a schematic cross sectional top view of a known apparatus for performing a plasma chemical vapour deposition process.

FIG. 1 shows a schematic cross sectional side view of a known apparatus for performing a plasma chemical vapour deposition process. The apparatus 1 comprises a mainly cylindrical resonator 2. The apparatus also comprises a microwave guide (not shown here) for guiding microwaves to the resonator 2. The microwave guide is preferably rectangular shaped so that an optimal interface between the guide and the resonator 2 can be made. The apparatus can be used for performing a plasma chemical vapour deposition process.

The resonator 2 is provided with an outer cylindrical wall 4 enclosing a resonant cavity 5. The cavity has a substantially rotational symmetric shape with respect to a cylindrical axis C. The resonator 2 is further provided with side wall portions 6a,b bounding the resonant cavity 5 in a cylindrical direction CD.

The resonator 2 further includes an inner cylindrical wall 8 bounding the resonance cavity 5 in a radial direction R towards the cylindrical axis C. In fact, the cavity 5 is thus annular shaped. The inner cylindrical wall 8 has a slit 9 extending in a circumferential direction Ci around the cylindrical axis C in an uniform manner. By providing the slit 9, microwave energy may enter, from the resonance cavity 5, into a tubular inner space 10 surrounded by the resonator 2.

The slit 9 is in itself a small radial waveguide extending between the cavity 5 and the inner side of the resonator 2, i.e. the tubular inner space 10. In principle, the slit 9 can be as wide as the cavity 5 itself or smaller, even down to a few millimeters.

Generally, a slit has a circumferential dimension, a width dimension and a radial dimension. The circumferential dimension is the length of the slit 9 in the circumferential direction Ci, around the cavity 5, while the width dimension is the width of the slit in the cylindrical direction CD. Further, the radial dimension is the depth of the slit, in the radial direction R.

In the shown embodiments, the circumferential dimension of the slit sections is larger than the width dimension of the slit sections.

The apparatus 1 is placed in a furnace (not shown) to condition operation temperature during the application of the plasma chemical vapour deposition process.

During operation of the known apparatus 1, microwaves generated by a microwave generator, such as a magnetron or klystron (not shown), are injected into a second end of the microwave guide, also called waveguide, and then guided through the waveguide towards the resonator 2. It is noted that the microwaves may enter the waveguide also in another manner, e.g. via an assembly of additional waveguides. In the resonance cavity 5 microwave energy accumulates. The microwave energy partly enters, via the slit 9, the tubular inner space 10 and generates a plasma inside a substrate tube 11, for carrying out a plasma chemical vapour deposition (PCVD) process. By conditioning proper gas flows (e.g. $SiCl_4$, $GeCl_4$, $O_2$, $C_2F_6$, etc) and reciprocating the resonator 2 over the length of the substrate tube 11, glass material is deposited on the inner surface 11a of the substrate tube 11 that has been inserted in the tubular inner space 10, see FIG. 3a, thereby providing a tube with multiple glass layers deposited on the inside. Such a tube can be collapsed to form a solid preform or core rod, which can be further processed for manufacturing a glass fiber.

Figure 2A:
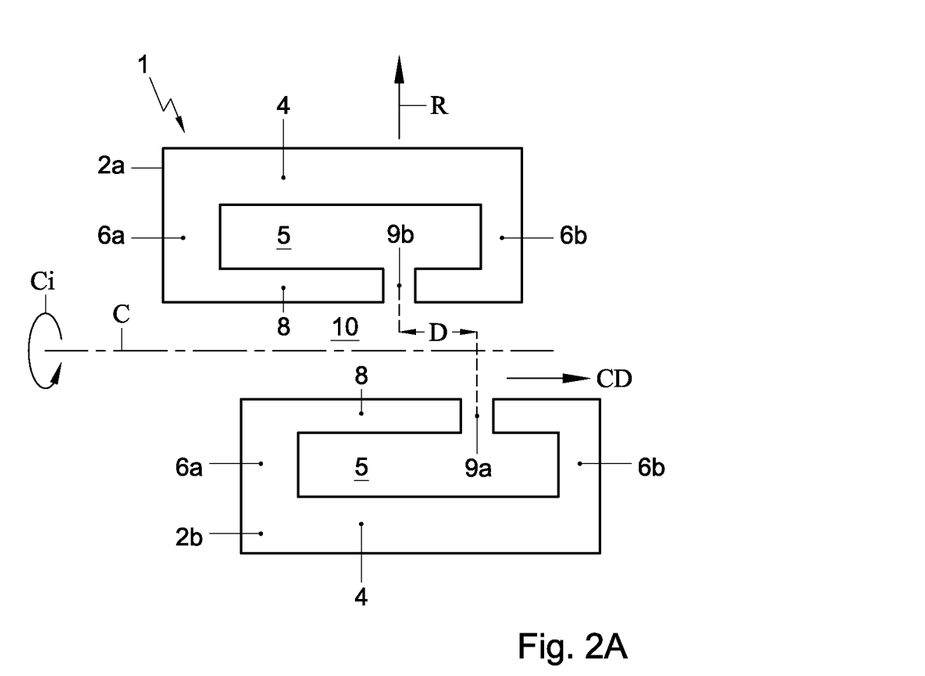
FIG. 2*a* shows a schematic cross sectional top view of a first embodiment of an apparatus according to the invention.
Figure 2B:
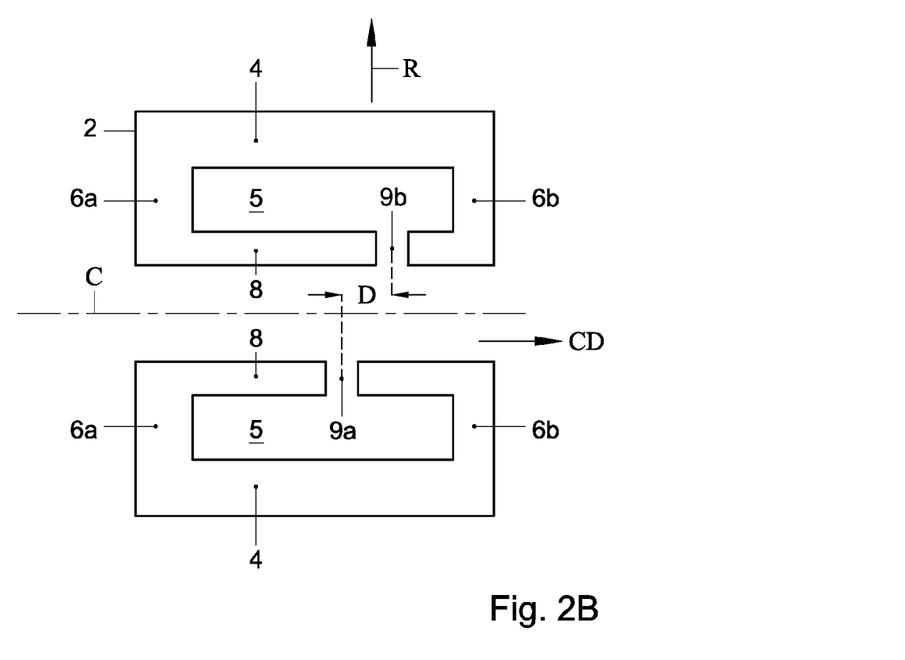
FIG. 2*b* shows a schematic cross sectional top view of a second embodiment of an apparatus according to the invention.
Figure 2C:
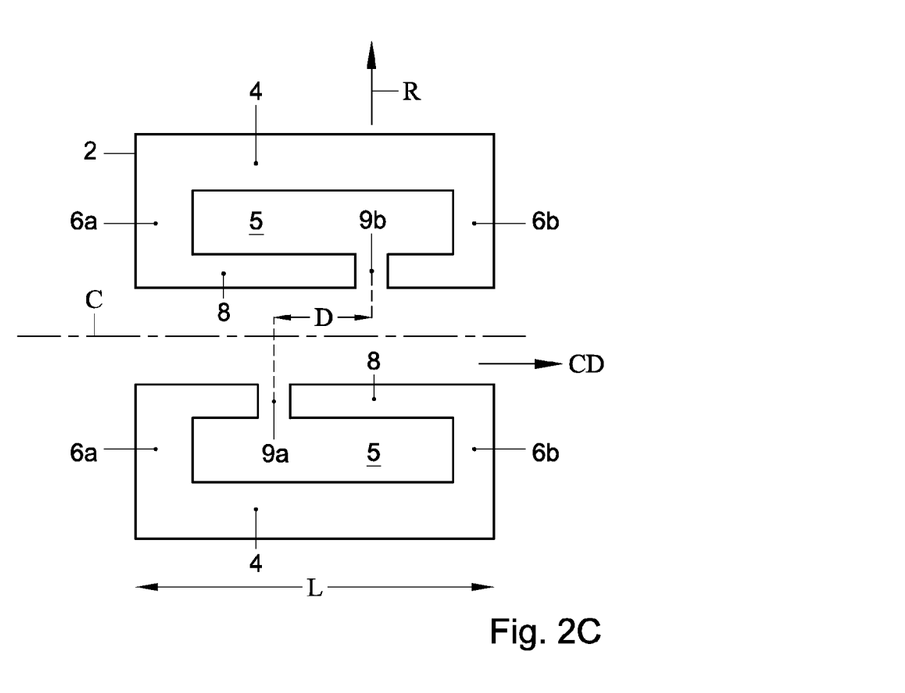
FIG. 2*c* shows a schematic cross sectional top view of a third embodiment of an apparatus according to the invention.

FIGS. 2a-c show a schematic cross sectional top view of a first, second and third embodiment, respectively, of an apparatus according to the invention. Here, the slit 9 constitutes a slit configuration including a pair of slit sections 9a,b that are mutually offset in the cylindrical direction CD.

Each of the slit sections 9a,b in FIG. 2a-c extends in the circumferential direction Ci in a range of a semi-circle. The circumferential end position of a first slit section 9a substantially coincides with the circumferential starting position of a second slit section, so that the slit sections 9a,b do not overlap in the circumferential direction Ci. The pair of slit sections 9a,b face each other at opposite sides of around the tubular inner space 10, when seen in the cylindrical direction CD. The staggered slit sections 9a,b form a slit configuration that extends in the circumferential direction as a full circle. The cavity 5 includes two cavity parts corresponding with the slit sections, and extends in a circumferential direction around the cylindrical axis CD.

The offset D between the slit sections 9a,b is circa a quarter of the operating plasma wavelength, so that the effect of the electromagnetic interaction with the furnace walls is minimized, preferably when rotating a substrate tube, as described below. More specifically, the offset between slit sections 9a,b is larger than circa 5 mm, preferably in a range from circa 30 mm to circa 50 mm.

In the embodiment as shown in FIG. 2a, the resonator 2 includes two substantially identical semi resonator units 2a, 2b that are placed offset with respect to each other over an offset distance D in the cylindrical direction CD. In the shown embodiment, a first resonator unit 2a is maintained in the cylindrical position of the known resonator 2 while a second resonator unit 2b is shifted over the offset distance D.

FIGS. 2b,c show further embodiments of the apparatus according to the invention. Again, the slit sections 9a,b are offset with respect to each other in the cylindrical direction CD. In FIG. 2b, each of the slit sections 9a,b is shifted, in mutually opposite directions, with respect to the position of the slit 9 in the known resonator shown in FIG. 2a. It is noted that also other slit section designs are possible, e.g. by locating the slits sections at positions that have no relation with the slit position in the known resonator. In FIG. 2c, the position of a first slit section 9b is similar to the slit position in the known resonator shown in FIG. 2a, while the position of a second slit section 9a is flipped over a half length L of the resonator 2 in the cylindrical direction CD. In the embodiments, shown in FIG. 2a,b the outer cylindrical wall 4 of the resonator 2 is mainly uniform in the circumferential direction Ci. The resonant cavity 5 as a whole has a substantially rotational symmetric shape. The resonator 2 can be formed integrally. Otherwise, the resonator can be constructed in a modular way, e.g. by using semi cylindrical resonator units 2a,b. In the embodiments shown in FIG. 2a,c, in principle, two identical resonator units 2a,b can be used. The two plasma halves are preferably generally identical in terms of power consumption and position compared to each other. The resonator units 2a,b come physically through a high field intensity region and a low field intensity region in the furnace at different times. Since the substrate tube 11 rotates every pass of the resonator, the total effect on the deposition is more homogeneous in terms of refractive index and/or thickness of the deposited layers than in the deposition that occurs in the known apparatus shown in FIG. 1.

Figure 3A:
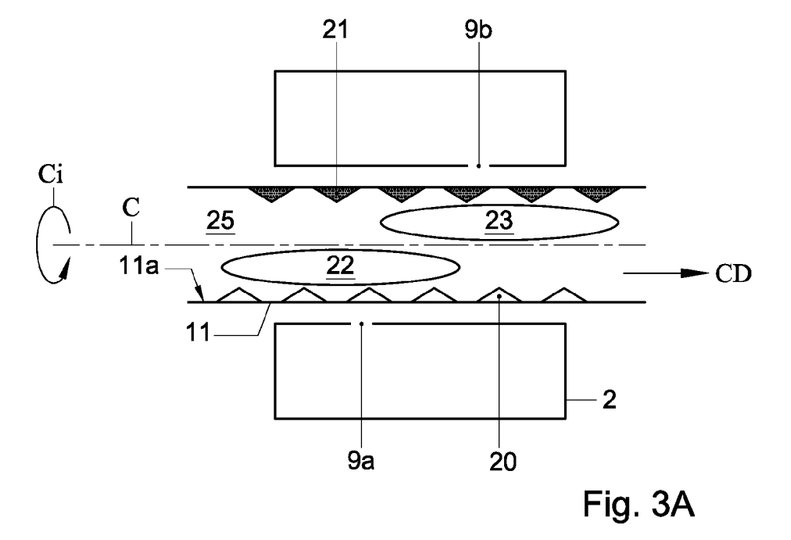
FIG. 3*a* shows another schematic cross sectional top view of the apparatus of FIG. 2*c*.
Figure 3B:
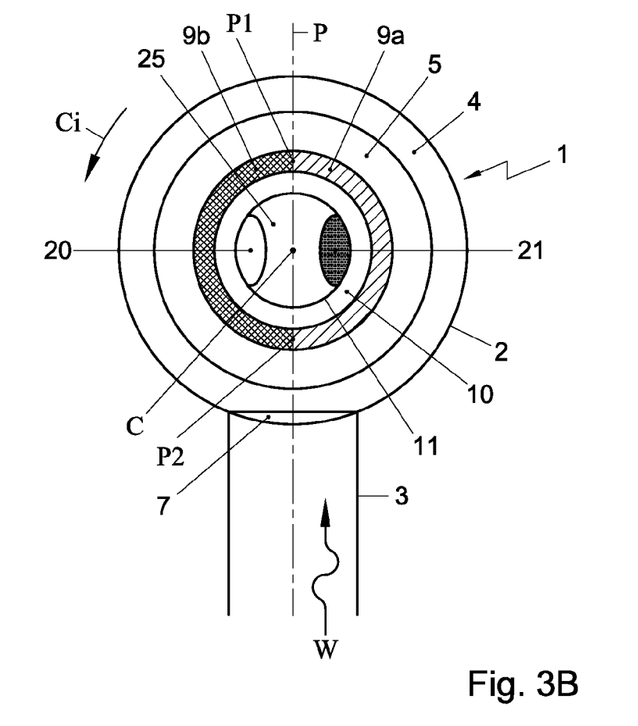
FIG. 3b shows a schematic view of the apparatus of FIG. 2c in a cross section along a vertical plane of symmetry of a microwave guide.

FIG. 3a shows another schematic cross sectional top view of the apparatus of FIG. 2c, while FIG. 3b shows a schematic view of the apparatus of FIG. 2c in a cross section along a vertical plane of symmetry P of a microwave guide. As clearly shown in FIG. 3b, the circumferential end position P1 of the first slit section 9a substantially coincides with the circumferential starting position of the second slit section 9b. Similarly, the circumferential end position P2 of the second slit section 9b substantially coincides with the circumferential starting position of the first slit section 9a, so that the slit sections 9a,b do not overlap in the circumferential direction Ci. The pair of slit sections 9a,b face each other at opposite sides of around the tubular inner space 10, when seen in the cylindrical direction CD. As mentioned above, the apparatus according to the invention comprises a microwave guide having an end 7 extending through the outer cylindrical wall 4 into the resonant cavity 5 for guiding microwaves into the cavity 5. Thereto, a microwave generator (not shown) is connected to the second end of the waveguide.

In order to reduce the sensitivity to arcing, sharp outer edges in the design of the resonator are avoided. A first outer edge is often encountered at the interface between the waveguide and the cavity 5. In the apparatus shown in FIG. 3 (and also in the apparatus shown in FIG. 2b), the width of the cavity 5, i.e. the internal distance along the cylindrical axis C, mainly equals the corresponding size of the waveguide, e.g. a standard measure of 3.4 inch, 86.38 mm, thereby avoiding one outer edge. The difference in width of the cavity 5 and the largest side of the waveguide can be small, i.e. smaller than 10 mm, e.g. smaller than 5 mm, or even smaller than 1 mm, especially when using power levels above 6 kW. The arcing effect of the other outer edge in the interface can be minimized by rounding the edge.

During operation of the apparatus, a substrate tube 11 is present in the tubular space 10 surrounded by the resonator 2. As shown in FIG. 3a, the microwaves traveling through the mutually shifted slit sections 9a,b generate plasmas 22, 23 in the interior 25 of the tube 11 causing the deposition of glass material 20, 21 on the inner surface 11a of the substrate tube 11. The deposited glass material has a period structure as illustrated in FIG. 3a,b. The thickness of the deposition 20, 21 is non-uniform in the cylindrical direction CD. Both, the deposition 20 on the left-hand side of the substrate tube 11 and the deposition 21 on the right-hand side of the substrate 11 have the periodic thickness profile. Due to the offset in the plasmas 22, 23, also the thickness distribution of the depositions 20, 21 are mutually offset in the cylindrical direction CD. The specific offset distance can be set by selecting an appropriate offset distance between the slit sections 9a,b. Preferably, the offset distance D is circa a quarter of the operating wavelength. As an example, the offset distance D can be chosen as circa 30 mm if the operating frequency of the resonator is 2.46 GHz.

By rotating the substrate tube 11 during operation of the plasma, with respect to the cylindrical axis of the resonator 2, the left-hand side deposition 20 and the right-hand side deposition 21 sequentially interchange, so that the thickness distribution of the overall deposition becomes more uniform, flattens. Consequently, also the refractive index of the deposited layers will become more uniform.

As shown in FIG. 3b, the locations of the slit sections 9a,b are symmetric with respect to the plane of symmetry P of the microwave guide feeding the resonator 2 with microwaves W. Here, the cylindrical axis C extends in the plane of symmetry P of the microwave guide.

The slit sections 9a,b are radial waveguides ranging from the cavity 5 to the tubular space 10 surrounded by the resonator 2. In radial waveguides, radial modes of electromagnetic fields may exist. The total inner circumference section of the slit sections 9a,b (360°), when forming an entire ring, see FIG. 1, is larger than the wavelength of the applied microwaves and smaller than twice the wavelength, there are 3 modes: a rotational symmetric mode (rotationally invariant) and two rotational asymmetric modes (i.e. angle/phi dependency of sin(phi) and cos(phi)). As an example, the microwave wavelength is circa 122 mm at an operating frequency of circa 2.46 GHz. In the configuration described above with respect to FIG. 3a,b the symmetry plane P of the microwave guide coincides with the vertical symmetry plane of the resonator 2.

In a particular case, the microwave guide is formed as a rectangular waveguide of which the smaller side is perpendicular to the symmetry plane P, so that the larger side is parallel to the symmetry plane P. Then, during operation, only a single mode exists in the slit sections 9a,b of which the total inner circumference (360°) is between 1 and 2 times the wavelength of the applied microwaves. Due to the field symmetry with the rectangular waveguide, the components of the electric field parallel to the symmetry plane P vanish. A very thin metallic plate could be put in the vertical plane without changing the functionality of the whole configuration. The insight that the resonator slit can be split in sections, while maintaining functionality, is exploited in the apparatus according to the invention.

Figure 4A:
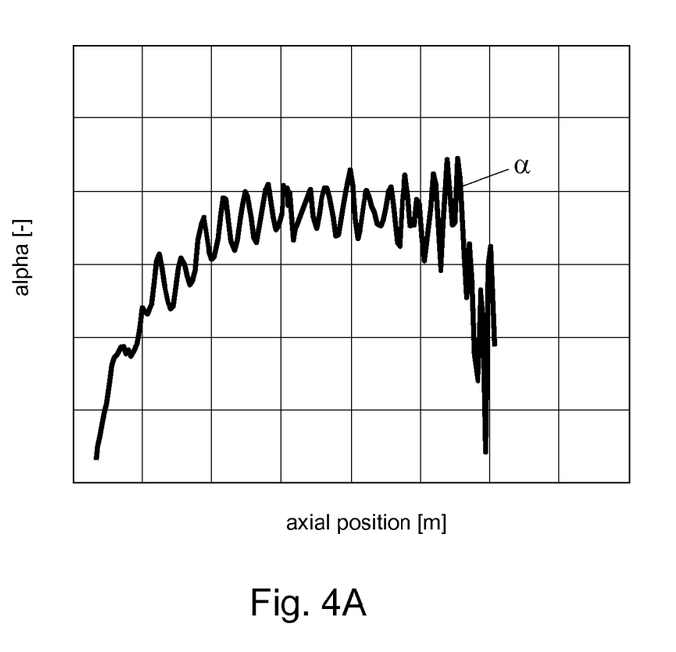
FIG. 4a shows a graph depicting alpha as a function of an axial position of a core rod produced by a known apparatus.

FIG. 4a shows a graph depicting alpha ($\alpha$) as a function of an axial position of a core rod produced by a known apparatus, e.g. as depicted in FIG. 1. The parameter alpha is a well known measure obtained from a so-called alpha fit of a near parabolic profile multimode core rod associated with thickness and/or refractive index variations along an axial position of the core rod. The parameter alpha exhibits, in a certain axial position range, variations. These nearly periodic variations of the parameter alpha as a function of the axial position have strong negative impact on some resulting fiber quality parameters such as attenuation, bandwidth, system performance and the uniformity of these parameters along the fiber length. The variations have a periodic distance of circa 6 cm caused by electromagnetic interaction with inner walls of the furnace in which the apparatus 1 is placed.

Figure 4B:
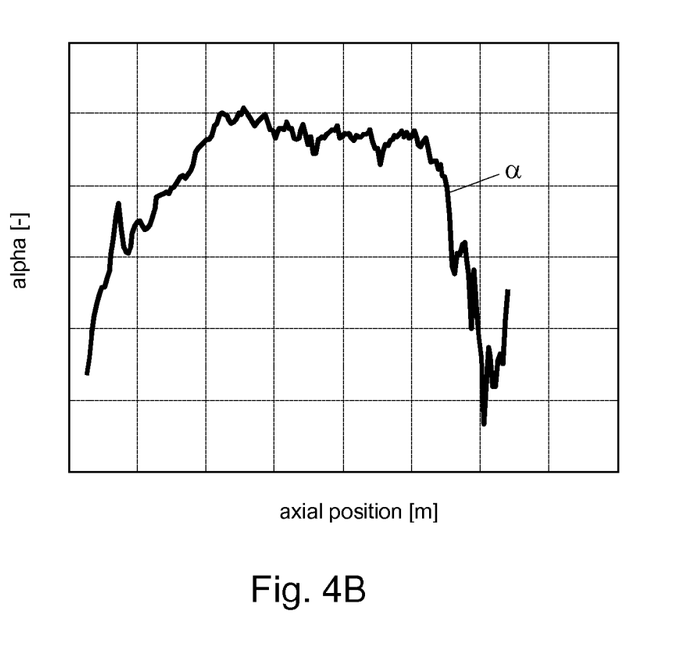
FIG. 4b shows a graph depicting alpha as a function of an axial position of a core rod produced by an apparatus according to the invention.

FIG. 4b shows a graph depicting alpha ($\alpha$) as a function of an axial position of a core rod produced by an apparatus 1 according to the invention. Here, the parameter alpha curve is more smooth. The amplitude of the variations is significantly smaller than the variation amplitude in the curve of the core rod that has been produced by a known apparatus, see FIG. 4a. As a result, also the fiber quality parameters improve, e.g. in terms of attenuation, bandwidth, system performance and the uniformity of these parameters along the fiber length.

The invention is not restricted to the embodiments described herein. Because of its sensitivity the effect of the invention is illustrated by the alpha ($\alpha$) measured on core rods for multimode fiber. The invention also improves the attenuation and uniformity in mode-field diameter for single mode fiber and has a positive effect on the uniformity of dispersion and fiber cutoff wavelength values in dispersion managed single mode fibers, such as dispersion shifted or non-zero dispersion shifted fibers. It will be understood that many variants are possible.

The resonator may include further modules accommodating the components described above. Further, the cavity's inner surface is at least partly electrically conductive. Therefore, the walls are preferably made from metallic material such as steel.

It is noted that the slit configuration may include more than two slit sections, e.g. three or four slit sections that form a closed ring, when shown in the cylindrical direction CD.

In the shown embodiments, the slit sections are arranged such that a circumferential end position of a first slit section substantially coincides with the circumferential starting position of a second slit section, so that the slit sections link up in the circumferential direction Ci. However, in principle, other arrangements are possible, e.g. by allowing the slit sections to overlap or to be offset in the circumferential direction Ci.

The words "resonator" and "resonant cavity" are used in this application to identify structures that are commonly known in the field. These words are however not intended to exclude situations where there is no resonance of microwaves, such as in cases without substantial reflection and without significant absorption of microwave power in a plasma.

Other such variants will be apparent for the person skilled in the art and are considered to fall within the scope of the invention as defined in the following claims.

What is claimed is:

1. An apparatus for performing a plasma chemical vapor deposition process, comprising:
   a mainly cylindrical resonator being provided with an outer cylindrical wall and an inner cylindrical wall, enclosing an annular resonant cavity in a radial direction, the resonator extending in a circumferential direction around a cylindrical axis,
   the resonator further being provided with side wall portions bounding the resonant cavity in the cylindrical direction, and
   the inner cylindrical wall provided with a slit configuration extending in a circumferential direction around the cylindrical axis providing access from the resonant cavity radially inwardly,
   wherein the slit configuration includes slit sections that are mutually offset in the cylindrical direction, and
   wherein the slit sections are also staggered in the circumferential direction linking up in the circumferential direction as a closed ring, and
   wherein a substrate tube is received in a tubular inner space, radially inwardly from the resonant cavity, and wherein the substrate tube is arranged to rotate, during operation of the apparatus, with respect to the cylindrical axis of the resonator.

2. An apparatus according to claim 1, wherein each of the slit sections extends in the circumferential direction in a range of a semi-circle.

3. An apparatus according to claim 1, wherein a circumferential end position of a first slit section substantially coincides with the circumferential starting position of a second slit section.

4. An apparatus according to claim 1, wherein a circumferential dimension of the slit sections is larger than a width dimension of the slit sections.

5. An apparatus according to any of the preceding claim 1, wherein the slit is formed by a pair of slit sections that face each other when seen in the cylindrical direction.

6. An apparatus according to claim 1, wherein the offset between slit sections is circa a quarter of the plasma (microwave) wavelength.

7. An apparatus according to claim 1, wherein the offset between slit sections is larger than circa 5 mm, preferably in a range from circa 30 mm to circa 50 mm.

8. An apparatus according to claim 1, wherein the apparatus further comprises a microwave guide having an end extending through the outer cylindrical wall into the resonant cavity.

9. An apparatus according to claim 8, wherein the locations of the slit sections are symmetric with respect to a plane of symmetry of the microwave guide.

10. An apparatus according to claim 8, further comprising a microwave generator connector to a second end of the microwave guide.

11. Apparatus according to claim 1, wherein each slit section allows microwave energy to pass radially inwardly, and wherein the intensities of the corresponding passing microwave energy substantially match.

12. Apparatus according to claim 1, wherein the width of the slit sections mutually differs.

13. An apparatus according to claim 1, wherein the resonant cavity as a whole has a substantially rotational symmetric shape.

14. An apparatus according to claim 1, wherein the resonator includes two substantially identical semi resonator units that are placed offset with respect to each other in the cylindrical direction.

15. An apparatus according to claim 1, wherein the resonator is provided with an inner cylindrical wall bounding the resonance cavity in a radial direction towards the cylindrical axis, and wherein the slit is arranged in the inner cylindrical wall.

16. An apparatus according to claim 1, wherein the resonator is arranged for reciprocating along the substrate tube, in the cylindrical direction.

17. An apparatus according to claim 1, wherein the slit sections include a pair of slit sections configured to face each other at opposing sides of around a tubular inner space.

18. Method for performing a plasma chemical vapor deposition process, comprising the steps of:
   providing an apparatus comprising a mainly cylindrical resonator being provided with an outer cylindrical wall and an inner cylindrical wall enclosing an annular resonant cavity in a radial direction, the resonator extending in a circumferential direction around a cylindrical axis,
   the resonator further being provided with side wall portions bounding the resonant cavity in the cylindrical direction, and
   the inner cylindrical wall provided with a slit configuration extending in a circumferential direction around the cylindrical axis providing access from the resonant cavity radially inwardly,
   wherein the slit configuration includes slit sections that are mutually offset in the cylindrical direction, and
   wherein the slit sections are also staggered in the circumferential direction linking up in the circumferential direction as a closed ring,
   receiving a substrate tube in a tubular inner space, radially inwardly from the resonant cavity,
   injecting microwaves into the resonant cavity, and
   rotating the substrate tube with respect to the cylindrical axis of the resonator.

19. Method according to claim 18, further comprising a step of reciprocating the resonator along the substrate tube, in its cylindrical direction.

* * * * *